US012796178B2

(12) United States Patent
Wang et al.

(10) Patent No.: US 12,796,178 B2

(45) Date of Patent: Nov. 10, 2026

(54) LED CHIP AND PREPARATION METHOD THEREOF

(71) Applicant: HUAIAN AUCKSUN OPTOELECTRONICS TECHNOLOGY CO., LTD, Huaian (CN)

(72) Inventors: Sibo Wang, Huaian (CN); Dongmei Li, Huaian (CN); Han-Chung Liao, Huaian (CN)

(73) Assignee: HUAIAN AUCKSUN OPTOELECTRONICS TECHNOLOGY CO., LTD, Huaian (CN)

( * ) Notice: Subject to any disclaimer, the term of this patent is extended or adjusted under 35 U.S.C. 154(b) by 598 days.

(21) Appl. No.: 18/213,319

(22) Filed: Jun. 23, 2023

(65) Prior Publication Data

US 2023/0335682 A1 Oct. 19, 2023

Related U.S. Application Data

(63) Continuation-in-part of application No. PCT/CN2021/138500, filed on Dec. 15, 2021.

(30) Foreign Application Priority Data

Oct. 14, 2021 (CN) ......................... 202111200185.7
Oct. 14, 2021 (CN) ......................... 202122484455.3

(51) Int. Cl.
*H10H 20/832* (2025.01)
*H10H 20/814* (2025.01)

(52) U.S. Cl.
CPC ........ *H10H 20/835* (2025.01); *H10H 20/814* (2025.01)

(58) Field of Classification Search
CPC ............................................ H10H 20/83–841
See application file for complete search history.

(56) References Cited

U.S. PATENT DOCUMENTS

2018/0040767 A1* 2/2018 Jang ..................... H10H 20/814
2019/0051797 A1* 2/2019 Sung .................. H10H 20/8252

FOREIGN PATENT DOCUMENTS

CN 106206890 A 12/2016
CN 109659414 A 4/2019
CN 209199975 U 8/2019
CN 111048644 A 4/2020
CN 111799358 A * 10/2020 ........... H10H 20/831

OTHER PUBLICATIONS

International search report of PCT Patent Application No. PCT/CN2021/138500 issued on Apr. 26, 2022.

* cited by examiner

*Primary Examiner* — Molly K Reida

(57) ABSTRACT

The present disclosure relates to the field of semiconductor technology, in particular to an LED chip and a preparation method thereof. The LED chip comprises a substrate, an epitaxial layer, a current blocking layer, a current spreading layer, a first electrode layer, a first insulating layer, a second electrode layer, a second insulating layer, a support layer, a third electrode layer and a third insulating layer.

19 Claims, 6 Drawing Sheets

LED CHIP AND PREPARATION METHOD THEREOF

CROSS-REFERENCE TO RELATED APPLICATIONS

The present application is a Continuation-In-Part Application of PCT Application No. PCT/CN2021/138500 filed on Dec. 15, 2021, which claims the priority to the Chinese Patent Application with the filing No. 2021112001857, and entitled "LED Chip and Preparation Method thereof", and the Chinese Patent Application with the filing No. 2021224844553, and entitled "LED Chip", filed with the Chinese Patent Office on Oct. 14, 2021, the entire contents of which are incorporated herein by reference.

TECHNICAL FIELD

The present disclosure relates to the technical field of semiconductor manufacturing, in particular to an LED chip and a preparation method thereof.

BACKGROUND ART

As a new generation of light sources, LED is widely used in fields such as illuminating, display, backlight, and even optical communication. As a product with higher light efficiency, flip chip has been getting more favored from the market. The flip chip has more structures in processing and the manufacturing process is complicated, so there are higher requirements and challenges for reliability.

In the conventional ODR structure, as shown in FIG. 1, the metal layer of the P-type metal electrode extends below the N-type pad, which are separated from each other by $SiO_2$ insulating layer, so as to form the region shown in the dotted block. When the insulating layer is broken or cracked for some reason, the P-type electrode and the N-type pad may be connected to each other, which leads to the electric leakage, thus reducing the reliability of the existing LED during use.

SUMMARY

In view of this, the first object of the present disclosure is to provide an LED chip. By adding a support layer that is not connected to the second electrode layer and the third electrode layer, and adding an insulating layer that is isolated from the third electrode layer, the second electrode and the third electrode are insulated from each other, thereby the electric leakage phenomenon caused by the rupture of the insulating layer is avoided, which increases the reliability of the LED chip.

A second object of the present disclosure is to provide a preparation method for the LED chip above-mentioned.

To achieve the above-mentioned purpose of the present disclosure, the technical solutions specially adopted are as follows.

The present disclosure provides an LED chip, and the LED chip comprises: a substrate, an epitaxial layer, a current blocking layer, a current spreading layer, a first electrode layer, a first insulating layer, a second electrode layer, a second insulating layer, a support layer, a third electrode layer, and a third insulating layer, wherein the support layer is arranged between the second insulating layer and the third electrode layer;

the first electrode layer comprises at least one first P-type electrode and at least one first N-type electrode;

the second electrode layer comprises at least one second P-type electrode and at least one second N-type electrode; and the third electrode layer comprises at least one P-type pad and at least one N-type pad.

In the present disclosure, by adding the support layer and the third insulating layer, the pad of the third electrode layer is disconnected and insulated with the support layer, and the support layer is disconnected and insulated with the second electrode layer, but the third insulating layer is electrically communicated with the second electrode layer via a through hole penetrating through the second insulating layer and the third insulating layer. Moreover, the third insulating layer and the second insulating layer adopt the same photolithography to etch to form the holes, thereby the support layer is wrapped in the insulating $SiO_2$ film from all sides, so as to achieve the disconnection between the support layer and each layer of electrodes and realize the insulation between electrodes with opposite polarities, thus the electric leakage of the LED chip caused by the breakage of the insulating layer is effectively avoided.

In an optional embodiment of the present disclosure, the support layer is not electrically connected to any one of the electrode layers, which includes the P-zone support layer and the N-zone support layer, wherein the P-zone support layer covers the region of the second P-type electrode; and the N-zone support layer covers the region of the second N-type electrode; and the support layer further comprises a support layer of push pin region, which is arranged in the central region of the LED chip, and no electrode is arranged below the central region.

In an optional embodiment of the present disclosure, the thickness of the support layer is less than 2 μm.

In an optional embodiment of the present disclosure, the support layer is a metal layer or a metal oxide layer or a DBR reflective layer, wherein the metal layer comprises a monolayer of metals such as Cr, Al, Ag, Ni, Ti, Pt and Au, or a combined metal layer that consists of several monolayers of metals.

In an optional embodiment of the present disclosure, the distance between the side surface of the support layer and the third through hole and/or between the side surface of the support layer and the fourth through hole is greater than or equal to 5 μm.

In an optional embodiment of the present disclosure, the area of the support layer accounts for 50%-80% of the area of the LED chip.

In an optional embodiment of the present disclosure, the area of the third electrode layer accounts for 30%-55% of the area of the LED chip.

In an optional embodiment of the present disclosure, the area of the third electrode layer is smaller than the area of the support layer.

In an optional embodiment of the present disclosure, an isolation groove is provided between the second P-type electrode and the second N-type electrode, wherein the width of the isolation groove is greater than or equal to 15 μm.

In an optional embodiment of the present disclosure, the distance between the P-type pad and the N-type pad is greater than or equal to 50 μm.

In an optional embodiment of the present disclosure, the third electrode layer comprises at least one of Cr, Al, Ag, Ni, Ti, Pt, and Au, or a combined layer of several metals and/or alloys.

In an optional embodiment of the present disclosure, the third electrode layer is a Bump electrode containing Sn component.

In an optional embodiment of the present disclosure, the P-zone support layer and the N-zone support layer are sandwiched between the second insulating layer and the third insulating layer, respectively, wherein the P-zone support layer is provided with several fifth through holes, and the N-zone support layer is provided with several sixth through holes.

Each of the fifth through holes is communicated with the third through hole, and each of the sixth through holes is communicated with the fourth through hole.

In an optional embodiment of the present disclosure, the second insulating layer and the third insulating layer with the third through hole penetrating the P-zone support layer are provided, and the second insulating layer and the third insulating layer with the fourth through hole penetrating the N-zone support layer are provided.

In an optional embodiment of the present disclosure, one or more of the first insulating layer, the second insulating layer, and the third insulating layer are in a single-layer structure or a multi-layer structure or a DBR structure.

In an optional embodiment of the present disclosure, a thickness of the first insulating layer is greater than a thickness of the second insulating layer, and a thickness of the third insulating layer is greater than or equal to the thickness of the second insulating layer.

In an optional embodiment of the present disclosure, wherein the support layer has an Al or Ag metal reflective layer near the second insulating layer, and has a Ti adhesive layer near the third insulating layer.

The present disclosure also provides a method for preparing the LED chip, comprising the following steps:

(a) providing a substrate, and sequentially depositing an N-type semiconductive layer, a light-emitting layer, and a P-type semiconductive layer on the substrate to form an epitaxial layer;

(b) depositing $SiO_2$ on the epitaxial layer, obtaining a current blocking layer by photolithography, then obtaining a current spreading layer by depositing, and obtaining a PN step by etching;

(c) depositing a plurality of first P-type electrodes and a plurality of first N-type electrodes on the surface of the chip, wherein the plurality of first P-type electrodes and the plurality of first N-type electrodes are alternately distributed, and then depositing a first insulating layer;

(d) obtaining a first through hole and a second through hole respectively by photolithography above the first P-type electrode and the first N-type electrode, and depositing a second electrode layer, wherein the second P-type electrode communicates with the first P-type electrode through the first through hole, and the second N-type electrode communicates with the first N-type electrode through the second through hole;

(e) depositing a second insulating layer, a support layer and a third insulating layer in sequence, and obtaining a third through hole and a fourth through hole by etching the region without support layer which is above the second P-type electrode and the second N-type electrode; and (f) depositing a third electrode layer, wherein the P-type pad is connected to the second P-type electrode through the third through hole, and the N-type pad is connected to the second N-type electrode through the fourth through hole.

Compared with the prior art, the advantageous effects of the present disclosure are described below.

(1) The LED chip provided by the present disclosure, by adding a support layer that is not in contact with the second electrode layer and the third electrode layer and an insulating layer that is isolated from the third electrode layer, insulates the second electrode from the third electrode, thereby the electric leakage phenomenon caused by the rupture of the insulating layer is avoided, which increases the reliability of the LED chip.

(2) The LED chip provided by the present disclosure realizes the effect of preventing the perforation by the push pin, by adding a support layer at the central position of the chip, which further increases the reliability of the LED chip.

BRIEF DESCRIPTION OF DRAWINGS

In order to more clearly illustrate the technical solutions of the embodiments of the present disclosure, the drawings required to be used in the embodiments will be briefly introduced below. It should be understood that the following drawings only show some embodiments of the present disclosure, and therefore should not be regarded as a limitation on the scope. Those with ordinary skill in the art can also obtain other related drawings based on these drawings without inventive effort.

REFERENCE NUMERALS

Figure 1:
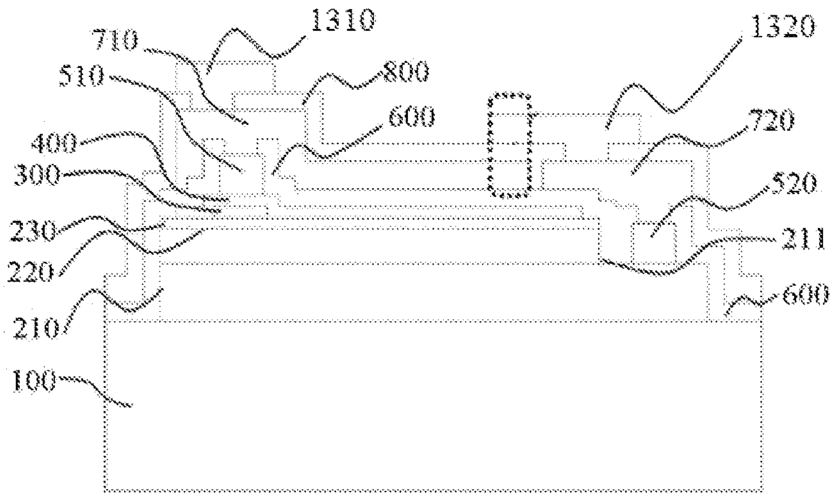
Fig. 1 (Prior Art)
FIG. 1 is a schematic sectional view of the ODR structure of a flip LED chip in the prior art.

| | |
|---|---|
| 100- | substrate |
| 200- | epitaxial layer |

-continued

| | |
|---|---|
| 210- | N-type semiconductive layer |
| 211- | PN step |
| 220- | light-emitting layer |
| 230- | P-type semiconductive layer |
| 300- | current blocking layer |
| 400- | current spreading layer |
| 510- | first P-type electrode |
| 511- | first through hole |
| 520- | first N-type electrode |
| 521- | second through hole |
| 600- | first insulating layer |
| 710- | second P-type electrode |
| 720- | second N-type electrode |
| 800- | second insulating layer |
| 900- | support layer |
| 910- | P-zone support layer |
| 920- | N-zone support layer |
| 930- | support layer of push pin region |
| 940- | fifth through hole |
| 950- | sixth through hole |
| 1000- | third insulating layer |
| 1100- | third throughhole |
| 1200- | fourth through hole |
| 1310- | P-type pad |
| 1310- | N-type pad |

DETAILED DESCRIPTION OF EMBODIMENTS

In order to make the purpose, technical solutions and advantages of the embodiments of the present disclosure clearer, the technical solutions in the embodiments of the present disclosure will be clearly and completely described below in conjunction with the drawings in the embodiments of the present disclosure. Obviously, the described embodiments are only a part of the embodiments of the present disclosure, not all of them. The components generally described and illustrated in the drawings of the embodiment of the present disclosure herein can be arranged and designed in a variety of different configurations. Accordingly, the following detailed description of the embodiments of the present disclosure provided in the drawings is not intended to limit the scope of the present disclosure claimed, but merely represents selected embodiments of the present disclosure. Based on the embodiments of the present disclosure, all other embodiments obtained by those skilled in the art without inventive effort shall fall within the protection scope of the present disclosure.

Figure 2:
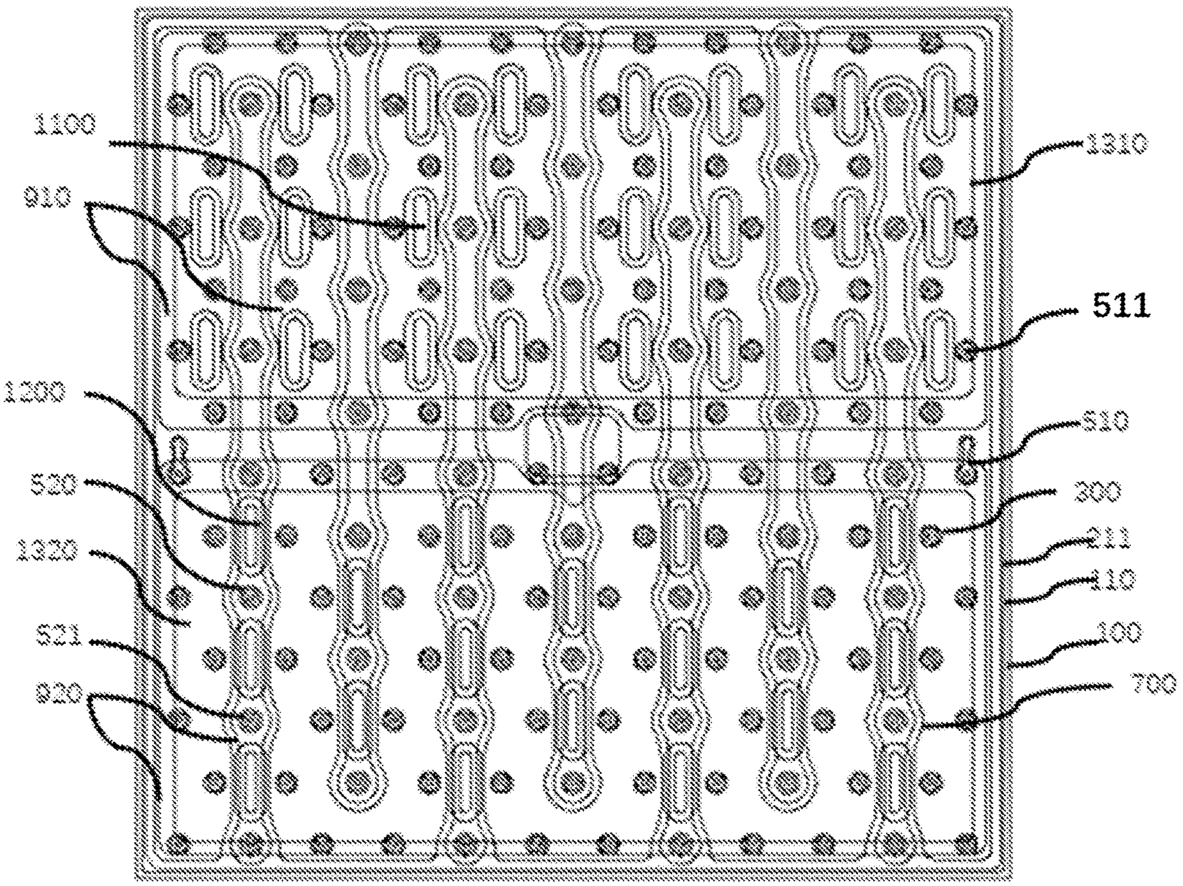
FIG. 2 is a schematic plan view of an LED chip provided by an embodiment of the present disclosure.
Figure 3:
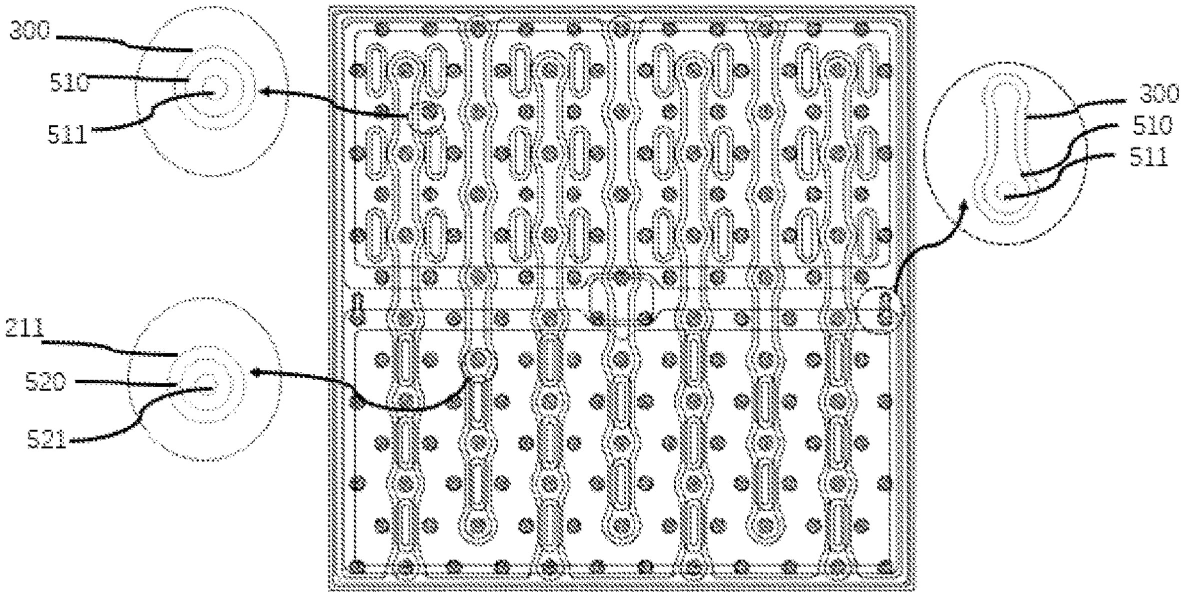
FIG. 3 is a partial enlarged view of a schematic plan view of the LED chip provided by the present disclosure.
Figure 4:
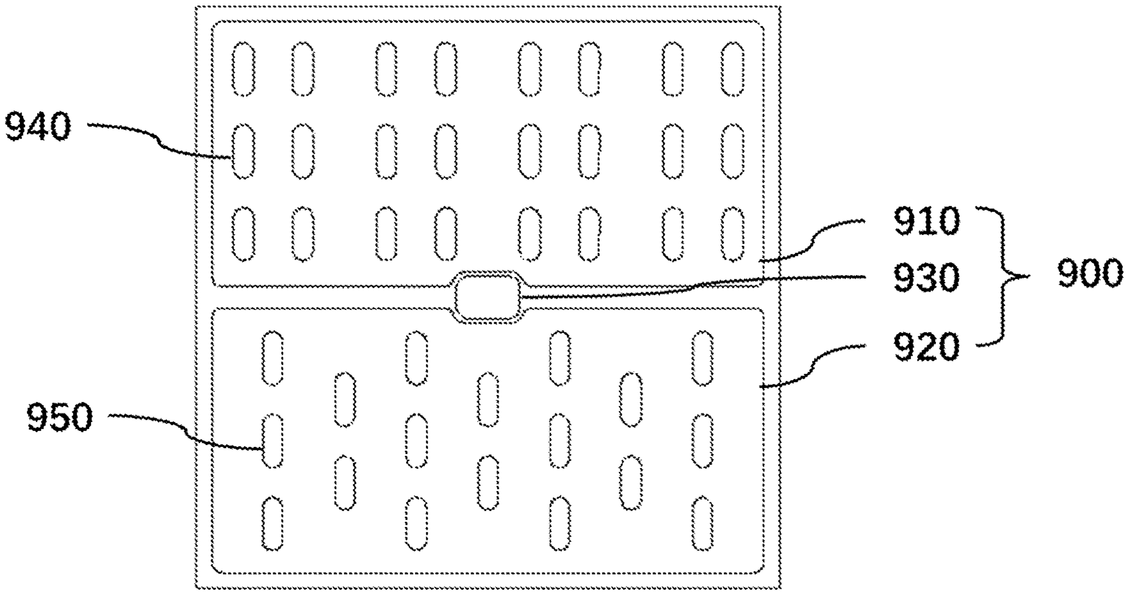
FIG. 4 is a schematic view of the plane layout of the support layer of the LED chip provided by the embodiment of the present disclosure.
Figure 5:
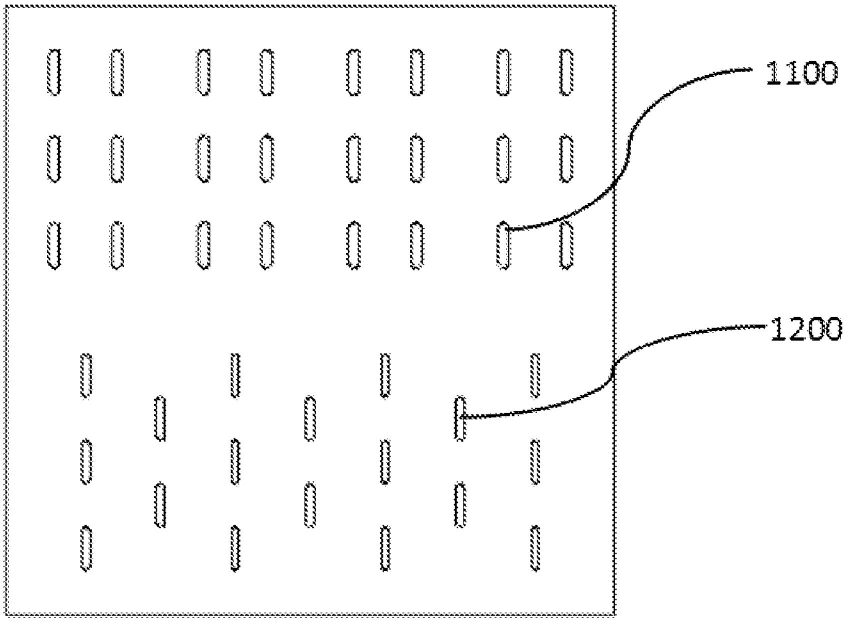
FIG. 5 is a schematic view of the plane layout of the third through hole and the fourth through hole corresponding to the schematic view of the plane layout of the support layer of the LED chip shown in FIG. 4.
Figure 6:
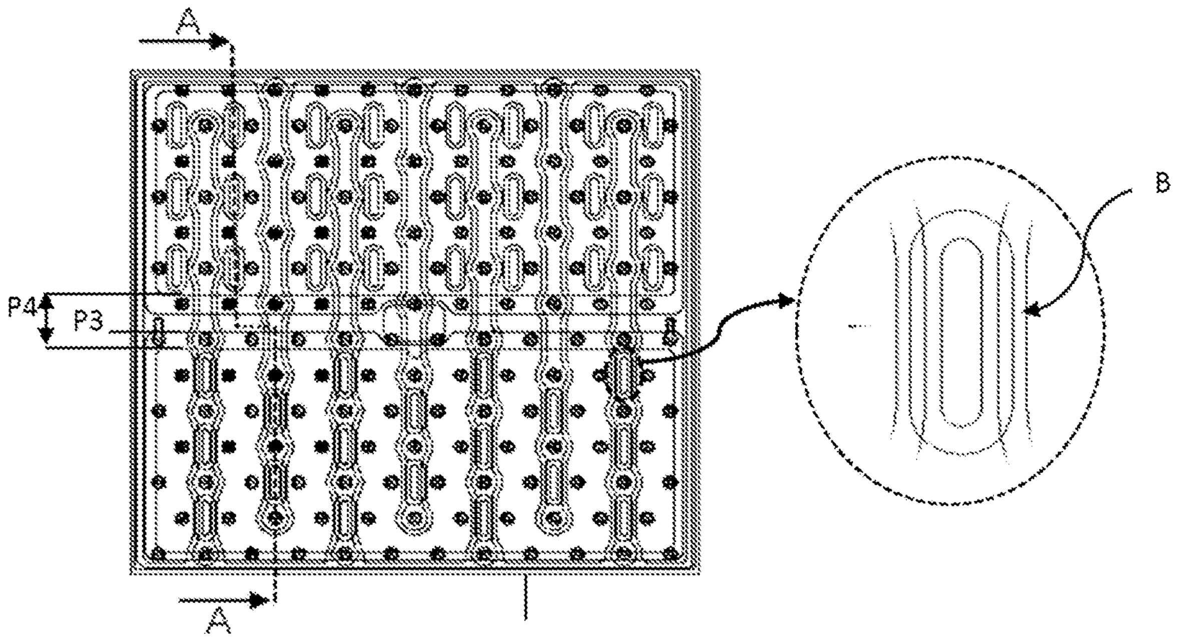
FIG. 6 is a schematic view of the NP distance between the second electrode layer and the third electrode layer of the LED chip provided by the embodiment of the present disclosure.
Figure 7:
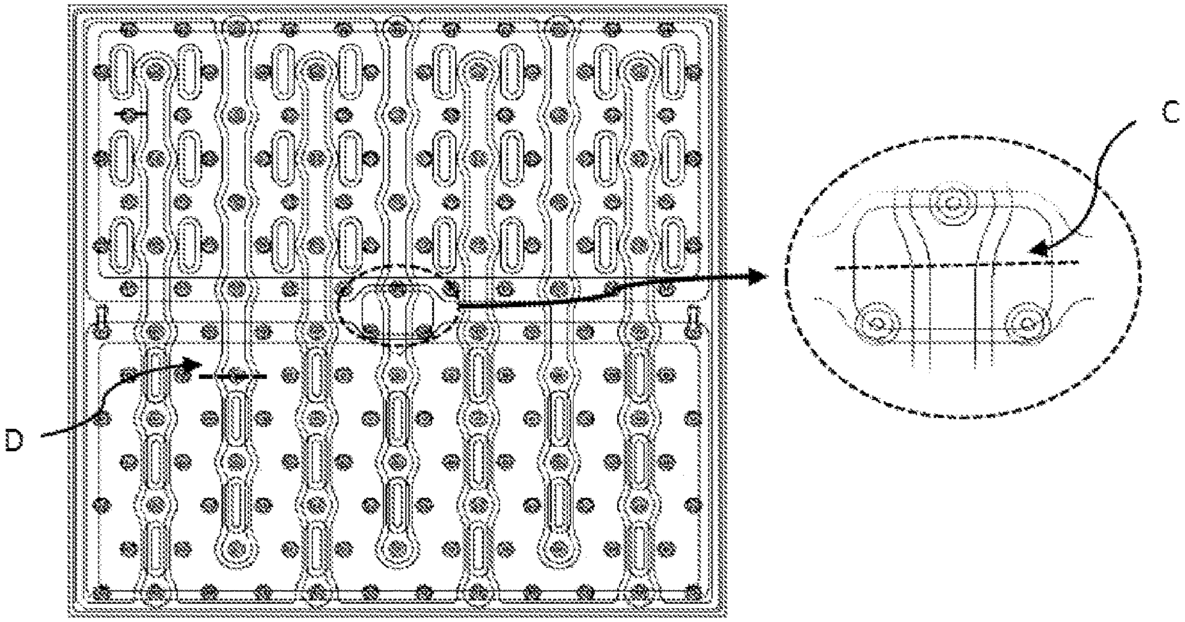
FIG. 7 is a partially enlarged plan view of the push pin region of the LED chip provided by the embodiment of the present disclosure.
Figure 8:
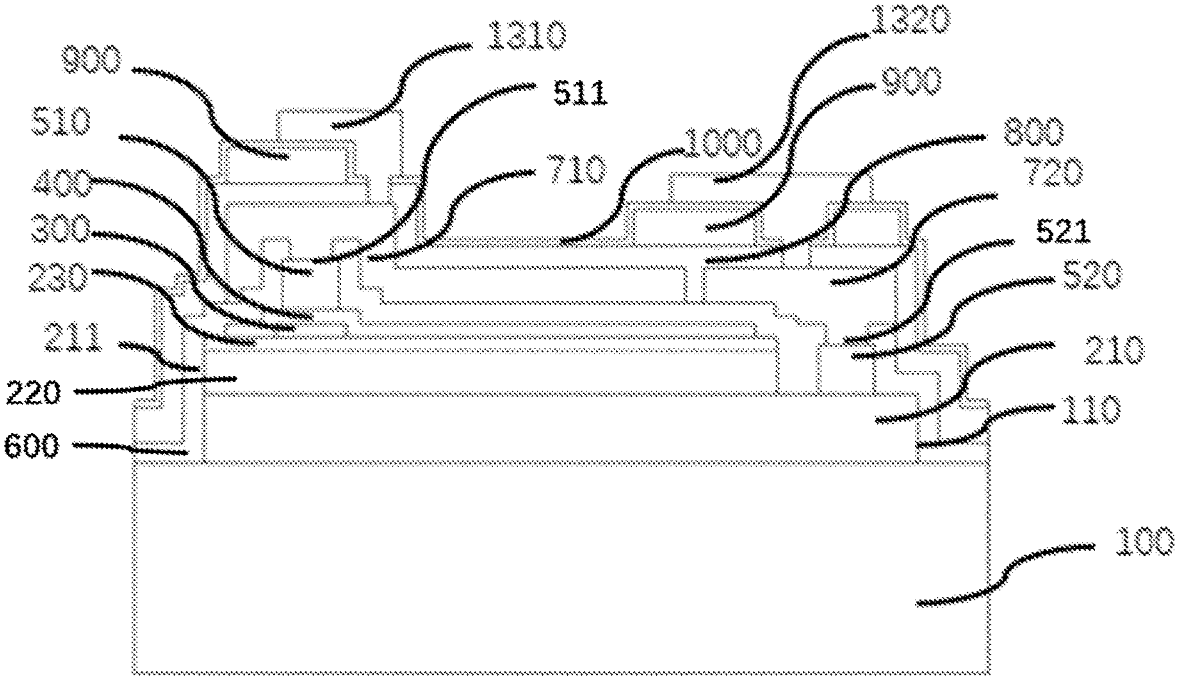
FIG. 8 is a partial sectional schematic view obtained according to the cutting method A shown in FIG. 6.
Figure 9:
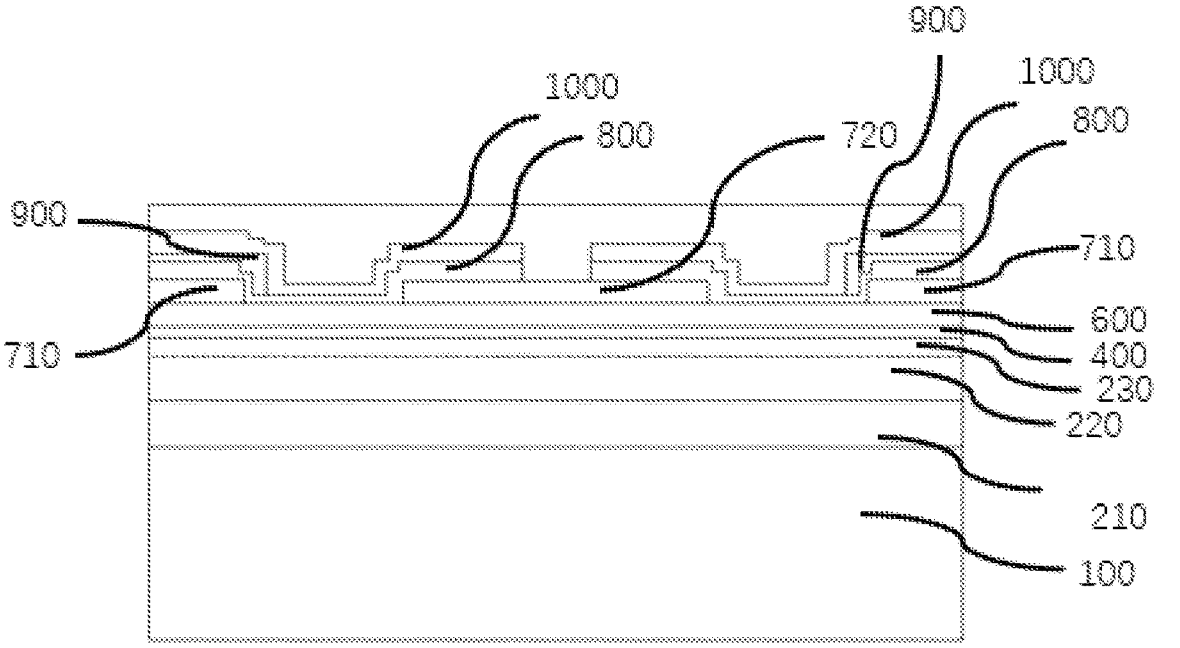
FIG. 9 is a partial sectional schematic view obtained according to the cutting method B shown in FIG. 6.
Figure 10:
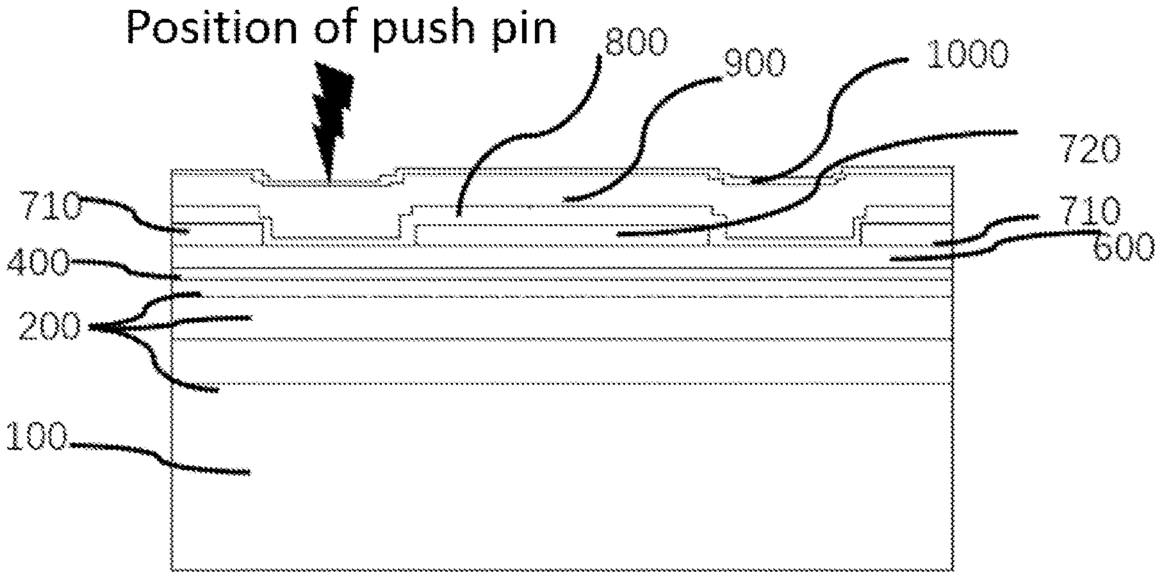
FIG. 10 is a partial sectional schematic view obtained according to the cutting method C shown in FIG. 7.
Figure 11:
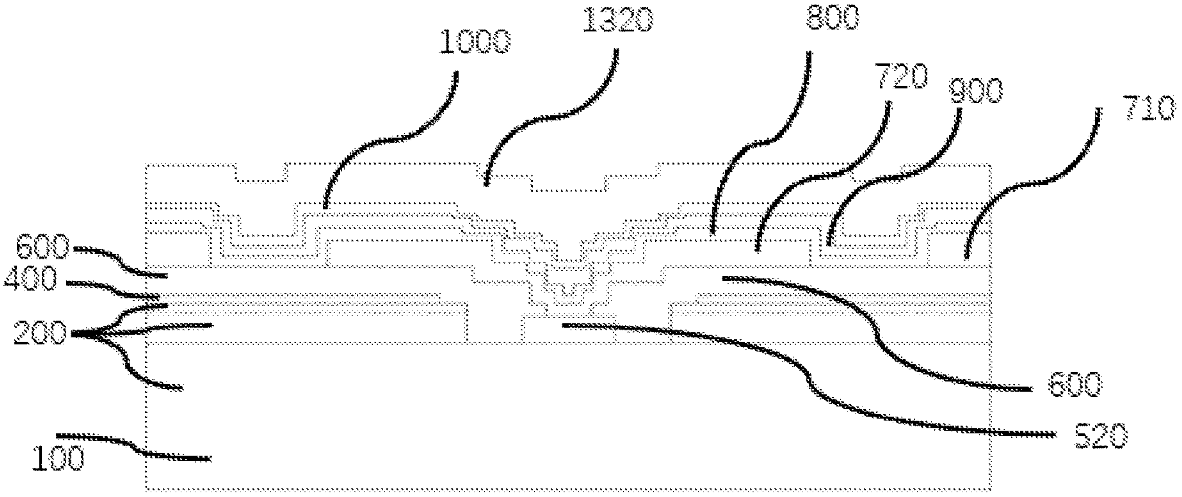
FIG. 11 is a partial sectional schematic view obtained according to the cutting method D shown in FIG. 7.

FIG. 2 is a schematic plan view of an LED chip provided by an embodiment of the present disclosure; FIG. 3 is a partial enlarged view of a schematic plan view of the LED chip provided by the present disclosure; FIG. 4 is a schematic view of the plane layout of the support layer 900 of the LED chip provided by the embodiment of the present disclosure; FIG. 5 is a schematic view of the plane layout of the third through hole 1100 and the fourth through hole 1200 corresponding to the schematic view of the plane layout of the support layer 900 of the LED chip shown in FIG. 4; FIG. 6 is a schematic view of the NP distance between the second electrode layer and the third electrode layer of the LED chip provided by the embodiment of the present disclosure; FIG. 7 is a partially enlarged plan view of the push pin region of the LED chip provided by the embodiment of the present disclosure; FIG. 8 is a partial sectional schematic view obtained according to the cutting method A shown in FIG. 6; FIG. 9 is a partial sectional schematic view obtained according to the cutting method B shown in FIG. 6; FIG. 10 is a partial sectional schematic view obtained according to the cutting method C shown in FIG. 7; and FIG. 11 is a partial sectional schematic view obtained according to the cutting method D shown in FIG. 7. The embodiment of the present disclosure provides an LED Chip, and the LED chip comprises: a substrate 100, an epitaxial layer 200, a current blocking layer 300, a current spreading layer 400, a first electrode layer, a first insulating layer 600, a second electrode layer, a second insulating layer 800, a support layer 900, a third electrode layer, and a third insulating layer 1000, wherein the support layer 900 is arranged between the second insulating layer 800 and the third electrode layer, and is not electrically connected to any one of the electrode layers;

the first electrode layer comprises at least one first P-type electrode 510 and at least one first N-type electrode 520;

the second electrode layer comprises at least one second P-type electrode 710 and at least one second N-type electrode 720; and the third electrode layer comprises at least one P-type pad 1310 and at least one N-type pad 1320.

Other structures are configured as those of the conventional LED chips. In particular, an epitaxial layer 200 is arranged on the surface of the substrate 100, and the epitaxial layer 200 comprises an N-type semiconductive layer 210, a light-emitting layer 220 and a P-type semiconductive layer 230 arranged on the surface of the substrate 100 layer by layer.

The epitaxial layer 200 comprises a PN step 211, wherein the upper step surface of the PN step 211 is the P-type semiconductive layer 230, and the lower step surface is N-type semiconductive layer 210; and the upper step surface and the lower step surface is connected to form the side surface of the PN step 211.

The current blocking layer 300 and the current spreading layer 400 are sequentially disposed on the surface of the P-type semiconductive layer 230.

The first electrode layer comprises a first P-type electrode 510 and a first N-type electrode 520; the first P-type electrode 510 is connected to the current spreading layer 400; and the first N-type electrode 520 is connected to the lower step surface of the PN step 211.

The first P-type electrode 510 and the first N-type electrode 520 are isolated from each other.

The first insulating layer 600 covers the first N-type electrode 520, the current spreading layer 400, the side surface of the PN step 211, the first P-type electrode 510, and the lower step surface located between the first N-type electrode 520 and the side surface of the PN step 211.

The first insulating layer 600 is provided with a first through hole 511 directly accessing the first P-type electrode 510 and a second through hole 521 directly accessing the first N-type electrode 520.

The second electrode layer comprises a second P-type electrode 710 and a second N-type electrode 720, wherein the second P-type electrode 710 and the second N-type electrode 720 are isolated from each other; the second P-type electrode 710 is connected to the first P-type electrode 510 through the first through hole 511; and the second N-type electrode 720 is connected to the first N-type electrode 520 through the second through hole 521.

The second insulating layer 800 is arranged on the surface of the second electrode layer.

The support layer 900 is arranged between the second insulating layer 800 and the third electrode layer.

The third insulating layer completely covers the surface formed by the second insulating layer 800 and the support layer 900.

The support layer 900 is insulated and isolated from the second electrode layer by the second insulating layer 800, and the support layer 900 is insulated and isolated from the third electrode layer by the third insulating layer.

In the present disclosure, by adding the support layer 900 and the third insulating layer, the pad of the third electrode layer is disconnected and insulated with the support layer 900, and the support layer 900 is disconnected and insulated with the second electrode layer. Moreover, the third insulating layer is electrically communicated to the second electrode layer via a through hole penetrating through the second insulating layer 800 and the third insulating layer. The third insulating layer and the second insulating layer 800 are etched to form holes via the same photolithography, so that the support layer 900 is wrapped in the insulating film from all sides, accordingly the support layer 900 and the electrodes of each layer are not connected to each other, which insulates and isolates the opposite electrodes, thereby the electric leakage of the LED chip caused by the breakage of the insulating layer is effectively avoided.

Figure 12:
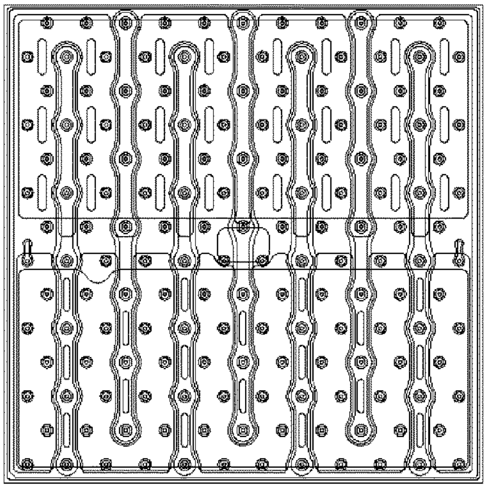
FIG. 12 is a schematic structural plan view of the LED chip provided by another embodiment of the present disclosure.

In order to further improve the reliability of the LED chip, as shown in FIG. 4 and FIG. 12, the support layer 900 comprises a P-zone support layer 910, an N-zone support layer 920, and a support layer of push pin region 930. The P-zone support layer 910 and N-zone support layer 920 are respectively arranged under the P-type pad 1310 and N-type pad 1320, and the support layer of push pin region 930 is arranged between the P-zone support layer 910 and N-zone support layer 920. From the top view, it can be seen that the shapes formed by the boundary lines of the P-type pad 1310 and N-type pad 1320 are respectively within the shapes formed by the boundary lines of the P-zone support layer 910 and N-zone support layer 920.

Since the support layer 900 is non-electrically arranged between the second insulating layer 800 and the third insulating layer 1000, it is necessary to have through holes for conductivity on the support layer 900, such as several fifth through holes 940 provided on the P-zone support layer 910 and several sixth through holes 950 provided on the N-zone support layer 920.

FIG. 5 is a schematic diagram of the plane structure after depositing the third insulating layer 1000 on the support layer 900 and then forming a hole, which includes a third through hole 1100 communicated with the fifth through hole 940 and a fourth through hole 1200 communicated with the sixth through hole 950. The area of the third through hole 1100 is smaller than that of the fifth through hole 940, and the area of the fourth through hole 1200 is smaller than that of the sixth through hole 950.

As shown in the partially enlarged view of FIG. 7, the support layer of push pin region 930 is arranged on the central region of the LED chip, and the newly added support layer is made of metal and thus has a stronger blocking capability comparing to the insulating layer, which protects the second insulating layer from being affected by the push pin, thus realizing the effect of preventing the breakage by the push pin.

The substrate 100 can comprise but is not limited to a sapphire substrate 100. Moreover, a patterned substrate 100 may also be selected. The material of the N-type semiconductive layer 210 may be N-type doped gallium nitride, and the material of the P-type semiconductive layer 230 may be P-type doped gallium nitride, but are not limited to these two semiconductor types.

The light-emitting layer 220 comprises quantum wells and quantum barriers which are alternately stacked, but is not limited thereto. The light-emitting layer 220 comprises but is not limited to a red-light light-emitting layer, a yellow-light light-emitting layer, a green-light light-emitting layer, or a blue-light light-emitting layer. The quantum well comprises but is not limited to InGaN quantum well or AlInGaN quantum well.

The current blocking layer 300 comprises but is not limited to $SiO_2$.

The current spreading layer 400 accounts for 70%-90% of the area of the LED chip, comprising but not limited to one of ITO, ZITO, ZIO, GIO, ZTO, FTO, AZO and GZO. Further, the thickness of the current spreading layer 400 ranges from 150 Å to 2000 Å, such as 150 Å, 200 Å, 300 Å, 500 Å, 800 Å, 1000 Å, 1500 Å, 1600 Å, 1800 Å and 2000 Å. Furthermore, the current spreading layer 400 can be obtained by depositing via magnetron sputtering or evaporation.

The first through hole 511 and the second through hole 521 are separated from each other without any extended crossing. As shown in FIG. 5, the third through hole 1100 and the fourth through hole 1200 are separated from each other without any extended crossing, so as to ensure the separation of the upper electrode and the lower heterogeneous electrode, thereby cutting off the possible electric leakage path.

In the embodiment of the present disclosure, as an optional embodiment, the first insulating layer 600 is a DBR reflective layer, wherein the DBR reflective layer may be formed by alternately depositing $SiO_2$ and $Ti_3O_5$, or alternately depositing $SiO_2$ and SiN. Furthermore, the thickness of the first insulating layer 600 ranges from 2 μm to 7 μm, more preferably from 3.5 μm to 5.5 μm.

In the embodiment of the present disclosure, as an optional embodiment, the second insulating layer 800 and/or the third insulating layer 1000 comprises at least one of silicon oxide, silicon nitride and silicon oxynitride.

The second insulating layer and/or the third insulating layer can also be in a multi-layer structure formed by any two or three materials of $SiO_2$, $TiO_2$, SiN, such as $SiN/SiO_2$ laminated structure layer, $SiO_2/TiO_2$ laminated structure layer, or $SiO_2/SiN/TiO_2$ laminated structure.

In the embodiment of the present disclosure, as an optional embodiment, the second insulating layer 800 and/or the third insulating layer has a thickness of 1 KÅ to 20 KÅ, for example, 1 KÅ, 6 KÅ, 8 KÅ, 13 KÅ, 16 KÅ, 19 KÅ and 20 KÅ.

In the embodiment of the present disclosure, as an optional embodiment, the support layer 900 may made of any material, for a better supporting effect and being suitable to the mature chip manufacturing process, the material of the support layer 900 may be a metal, and the metal layer comprises a monolayer of metals such as Al, Ag, Cr, Ni, Ti, Pt and Au, or a combined metal layer that consists of several monolayers of metals. Furthermore, in order to improve the reflectivity of the electrode, the support layer 900 is selected from Al or a composite metal layer with Al as the bottom layer, or from Ag or a composite metal layer with Ag as the bottom layer, such as Al, Cr/Al, Ti/Al, Ni/Al, Ag, Ni/Ag, Cr/Ag, and Ti/Ag; and the upper layer of the support layer near the third insulating layer can choose Au, Ti, or Pt. The support layer 900 can be Cr/Al/Cr/Pt/Au, Cr/Al/Ti/Ni/Pt/Ni/Pt/Au, Cr/Al/Ti/Pt/Ti/Pt/Ti/Pt/Au, Cr/Al/Ti/Ni/Pt, Cr/Al/Ti/Ni/Pt/Ni/Pt, Ag/Ti/Ni/Ti/Ni/Ti, and Ag/Ti/Ni/Ti, etc.

Correspondingly, the material of the second electrode layer is also selected from Al or a composite metal layer with Al as the bottom layer, or from Ag or a composite metal layer with Ag as the bottom layer, such as Al, Cr/Al, Ti/Al, Ni/Al, Ag, Ni/Ag, and Cr/Ag. In the embodiment of the present disclosure, as an optional embodiment, in order to ensure that each surface of the support layer 900 is covered by the insulating layer and that there is no metal exposed from any surface, referring to the schematic sectional view shown in FIG. 8, the distance from the side surface of the support layer 900 to the third through hole 1100 and/or the fourth through hole 1200 is greater than or equal to 5 μm.

In the embodiment of the present disclosure, as an optional embodiment, the thickness of the support layer 900 is less than 2 μm, and the area of the support layer 900 accounts for 50%-80% of the area of the LED chip, thereby the electrode reflectivity is ranging from 60% to 95%; and for the subsequent film coverage, the angle of metal electrode for this layer is required to be 30° to 75°.

In the embodiment of the present disclosure, as an optional embodiment, the material of the support layer 900 may be a metal oxide with a better light conductivity, such as indium tin oxide, zinc oxide, and tin oxide.

In the embodiment of the present disclosure, as an optional embodiment, the material of the support layer 900 may be a DBR reflective layer with insulating property, such as a $SiO_2/TiO_2$ DBR reflective layer.

In the embodiments of the present disclosure, as an optional embodiment, the area of the third electrode layer accounts for 30%-55% of the area of the LED chip.

In the embodiments of the present disclosure, as an optional embodiment, the area of the third electrode layer is smaller than that of the support layer 900.

In the embodiment of the present disclosure, as an optional embodiment, as shown in FIG. 6, an isolation groove is provided between the second P-type electrode 710 and the second N-type electrode 720, and the width P3 of the isolation groove is greater than or equal to 15 μm.

In the embodiment of the present disclosure, as an optional embodiment, as shown in FIG. 6, the distance P4 between the P-type pad 1310 and the N-type pad 1320 is greater than or equal to 50 μm.

In the embodiment of the present disclosure, as an optional embodiment, the third electrode layer comprises a monolayer of metals such as Cr, Al, Ni, Ti, Pt and Au, or a combined layer of several metals and/or alloys. Furthermore, the thickness of Al is 5KÅ-20 KÅ, the thickness of Pt is 0.5 KÅ-3 KÅ, the thickness of Ti 0.5 KÅ-3 KÅ, the thickness of Ni is 3 KÅ-12 KÅ, and the thickness of Au is 1 KÅ-5 KÅ.

In the embodiment of the present disclosure, as an optional embodiment, the third electrode layer is a Bump electrode comprising the Sn component, further, the P-type pad 1310 and the N-type pad 1320 may be the Bump electrodes, wherein the composition of the electrode is Sn. Furthermore, the Bump electrode can be prepared by printing, electroplating or evaporation. The height of the Bump electrode is greater than or equal to 5 μm, and the height of solder paste is greater than or equal to 20 μm.

In the embodiment of the present disclosure, as an optional embodiment, in the third electrode layer, the number of P-type pad 1310 may be one or two or more; and the number of N-type pad 1320 may be one or two or more.

The embodiment of the present disclosure also provides a method for preparing the LED chip, particularly comprising the following steps:

(1) providing a substrate 100, and sequentially depositing an N-type semiconductive layer 210, a light-emitting layer 220, and a P-type semiconductive layer 230 on the substrate 100 to form an epitaxial layer 200;

(2) depositing $SiO_2$ on the epitaxial layer 200, obtaining a current blocking layer 300 by photolithography, then depositing a current spreading layer 400; and etching a PN step 211 by means of corroding the ITO first and then etching, wherein in order to ensure the distance between ITO and PN step, the ITO is etched again before removing the photoresist, and after the photoresist is cleared, an ISO isolation groove is formed by yellow light and deep etching;

(3) depositing first P-type electrodes 510 and first N-type electrodes 520 on the surface of the chip, wherein the first P-type electrodes and the first N-type electrodes are alternately distributed, and then depositing a first insulation layer 600;

(4) obtaining a first through hole 511 and a second through hole 510 by photolithography above the first P-type electrode 510 and the first N-type electrode 520 respectively, and depositing a second electrode layer, wherein the second P-type electrode 710 is communicated to the first P-type electrode 510 through the first through hole 511, and the second N-type electrode 720 is communicated to the first N-type electrode 520 through the second through hole 521;

(5) depositing a second insulating layer 800, a support layer 900, and a third insulating layer in sequence, and etching a third through hole 1100 and a fourth through hole 1200 in the region above the second P-type electrode 710 and the second N-type electrode 720 where the support layer 900 is not provided, wherein the minimal distance between the etched through hole and the edge of the support layer 900 is greater than 5 μm, which ensures that all sides of the support layer 900 are completely wrapped in the second and third insulating layers, thereby the electrical communication between the support layer 900 and any metal electrodes is insulated;

(6) depositing a third electrode layer, wherein the P-type pad 1310 is connected to the second P-type electrode 710 through the third through hole 1100, and the N-type pad 1320 is connected to the second N-type electrode 720 through the fourth through hole 1200; and (7) performing grinding, scratching, etc. to form chiplets, wherein the grinding thickness ranges from 80 μm to 300 μm.

INDUSTRIAL PRACTICALITY

In summary, the present disclosure provides an LED chip. In the present disclosure, by adding a support layer that is not connected to the second electrode layer and the third electrode layer, and adding an insulating layer that is isolated from the third electrode layer, the second electrode and the third electrode are insulated and isolated, such that the electric leakage caused by the breakage of the insulating layer is avoided, thereby improving the reliability of the LED chip.

What is claimed is:

1. An LED chip, wherein the LED chip comprises: a substrate, an epitaxial layer with a PN step, a current blocking layer, a current spreading layer, a first electrode layer, a first insulating layer, a second electrode layer, a second insulating layer, a support layer, a third electrode layer and a third insulating layer, wherein the support layer is arranged between the second insulating layer and the third electrode layer;

the first electrode layer comprises at least one first P-type electrode and at least one first N-type electrode;

the second electrode layer comprises at least one second P-type electrode and at least one second N-type electrode; and the third electrode layer comprises at least one P-type pad and at least one N-type pad.

2. The LED chip according to claim 1, wherein the support layer is not electrically connected to any one of the electrode layers, comprising a P-zone support layer and an N-zone support layer, wherein the P-zone support layer covers a region of the second P-type electrode; and the N-zone support layer covers a region of the second N-type electrode.

3. The LED chip according to claim 1, wherein the support layer further comprises a support layer of push pin region, wherein the support layer of push pin region is arranged in a central region of the LED chip.

4. The LED chip according to claim 1, wherein a thickness of the support layer is less than or equal to 2 μm.

5. The LED chip according to claim 1, wherein the support layer is a metal layer, a metal oxide layer, or a DBR reflective layer.

6. The LED chip according to claim 5, wherein the metal layer comprises at least one of Cr, Al, Ag, Ni, Ti, Pt and Au.

7. The LED chip according to claim 5, wherein a third through hole and a fourth through hole penetrating through the second insulating layer and the third insulating layer are provided; and the P-type pad is electrically connected to the second P-type electrode through the third through hole, and the N-type pad is electrically connected to the second N-type electrode through the fourth through hole, wherein a distance from a side surface of the support layer to the third through hole and/or the fourth through hole is greater than or equal to 5 μm.

8. The LED chip according to claim 1, wherein an area of the support layer accounts for 50%-80% of an area of the LED chip.

9. The LED chip according to claim 1, wherein an area of the third electrode layer accounts for 30-55% of an area of the LED chip.

10. The LED chip according to claim 9, wherein the area of the third electrode layer is smaller than an area of the support layer.

11. The LED chip according to claim 1, wherein an isolation groove is provided between the second P-type electrode and the second N-type electrode, and a width of the isolation groove is greater than or equal to 15 μm; and/or a distance between the P-type pad and the N-type pad is greater than or equal to 50 μm.

12. The LED chip according to claim 1, wherein the third electrode layer comprises at least one of Cr, Al, Ag, Ni, Ti, Pt, and Au; or the third electrode layer is a Bump electrode containing Sn component.

13. The LED chip according to claim 2, the P-zone support layer and the N-zone support layer are sandwiched between the second insulating layer and the third insulating layer, respectively, wherein the P-zone support layer is provided with several fifth through holes, and the N-zone support layer is provided with several sixth through holes.

14. The LED chip according to claim 13, the second insulating layer and the third insulating layer with the third through hole penetrating the P-zone support layer are provided, and the second insulating layer and the third insulating layer with the fourth through hole penetrating the N-zone support layer are provided.

15. The LED chip according to claim 14, each of the fifth through holes is communicated with the third through hole, and each of the sixth through holes is communicated with the fourth through hole.

16. The LED chip according to claim 1, one or more of the first insulating layer, the second insulating layer, and the third insulating layer are in a single-layer structure or a multi-layer structure or a DBR structure.

17. The LED chip according to claim 1, a thickness of the first insulating layer is greater than a thickness of the second insulating layer, and a thickness of the third insulating layer is greater than or equal to the thickness of the second insulating layer.

18. The LED chip according to claim 12, wherein the support layer has an Al or Ag metal reflective layer near the second insulating layer, and has a Ti adhesive layer near the third insulating layer.

19. A method for preparing the LED chip according to claim 1, wherein the method comprises following steps:

(a) providing the substrate, and sequentially depositing an N-type semiconductive layer, a light-emitting layer, and a P-type semiconductive layer on the substrate to form the epitaxial layer;

(b) depositing $SiO_2$ on the epitaxial layer, obtaining the current blocking layer by photolithography, then obtaining the current spreading layer by depositing, and obtaining the PN step by etching;

(c) depositing a plurality of first P-type electrodes and a plurality of first N-type electrodes on a surface of the chip, wherein the plurality of first P-type electrodes and the plurality of first N-type electrodes are alternately distributed, and then depositing the first insulating layer;

(d) obtaining first through holes and second through holes respectively by photolithography above the first P-type electrodes and the first N-type electrodes, and depositing the second electrode layer, wherein second P-type electrodes communicate with the first P-type electrodes through the first through holes, and second N-type electrodes communicate with the first N-type electrodes through the second through holes;

(e) depositing the second insulating layer, the support layer and the third insulating layer in sequence, and obtaining third through holes and fourth through holes by etching regions without the support layer which is above the second P-type electrodes and the second N-type electrodes; and (f) depositing the third electrode layer, wherein P-type pads are connected to the second P-type electrodes through the third through holes, and N-type pads are connected to the second N-type electrodes through the fourth through holes.

* * * * *